United States Patent [19]

Komatsuzaki et al.

[11] Patent Number: 5,498,897
[45] Date of Patent: Mar. 12, 1996

[54] TRANSISTOR LAYOUT FOR SEMICONDUCTOR INTEGRATED CIRCUIT

[75] Inventors: Katsuo Komatsuzaki, Ibaraki; Masayasu Kawamura, Kodaira; Hidetoshi Iwai, Ohme, all of Japan

[73] Assignees: Texas Instruments Incorporated, Dallas, Tex.; Hitachi Ltd.

[21] Appl. No.: 270,085

[22] Filed: Jul. 1, 1994

[51] Int. Cl.⁶ .......................... H01L 27/11; H01L 29/772
[52] U.S. Cl. ........................ 257/413; 257/369; 257/927
[58] Field of Search ............................... 257/927, 413, 257/369

[56] References Cited

U.S. PATENT DOCUMENTS 4,673,969  6/1987  Ariizumi .............................. 257/927
5,027,185  6/1991  Liauh .................................. 257/413

OTHER PUBLICATIONS

Leung et al, IEEE–IEDM Tech Dig. 1980 pp. 827–830 Wash D.C. "Refractory in CMOS/SOS".

*Primary Examiner*—Jerome Jackson
*Attorney, Agent, or Firm*—Lawrence J. Bassuk; William E. Hiller; Richard L. Donaldson

[57] ABSTRACT

A semiconductor integrated circuit comprising a MOSFET having a metal wiring layer formed via an insulating film above and along the gate electrode of the MOSFET. The MOSFET is structured such that its channel length is small or channel width is large, and an input signal is applied from at least both end sides of the gate electrode thereof. Since the metal wiring layer for the input signal is formed on the gate electrode of the MOSFET, high-speed operation is possible without increasing the layout area. FIG. 1.

8 Claims, 5 Drawing Sheets

TRANSISTOR LAYOUT FOR SEMICONDUCTOR INTEGRATED CIRCUIT

The present invention related to a semiconductor integrated circuit, and more particularly to semi-conductor integrated circuit technology effectively applicable to what is formed with a MOSFET (an insulated-gate field-effect transistor).

BACKGROUND OF THE INVENTION

As the channel length (L) is reduced or as the channel width Wp or Wn) is increased, the influence of a resistance at the gate electrode of a MOSFET becomes unignorable and switching characteristics deteriorate. Consequently, an arrangement has been made to reduce the influence of the gate resistance by supplying an input signal IN from both ends of the gate electrodes 502, 504 of the MOSFET inverter 500 as shown in FIG. 5.

In a circuit for supplying an input signal from both end sides of the gate electrode of such a MOSFET using two-layer wiring, the wire should be arranged in such a manner as to bypass the source 506, 508 and drain 570, 572 diffusion layers in substrate 514 as shown by a dotted line of FIG. 5 in order to prevent it from crossing a signal line for taking an output signal out of the MOSFET and wires for use in supplying power supply voltage Vcc and Vss. The problem in this case is that the layout area tends to increase.

It is an object of the present invention to provide a semiconductor integrated circuit designed to accomplish high-speed operation and increased integration by arranging a metal wiring layer associated with the gate electrode of a MOSFET in such a manner as to avoid an increase of the layout area.

SUMMARY OF THE INVENTION

A semiconductor integrated circuit according to the present invention comprises a MOSFET whose channel length is small or channel width is large, wherein a metal wiring layer is formed above and along the gate electrode of the MOSFET through an insulating film, and an input signal is applied from at least both end sides of the gate electrode.

With the arrangement above, high-speed operation becomes possible without increasing the layout area since metal wiring for an input signal is formed above the gate electrode.

Figure 1:
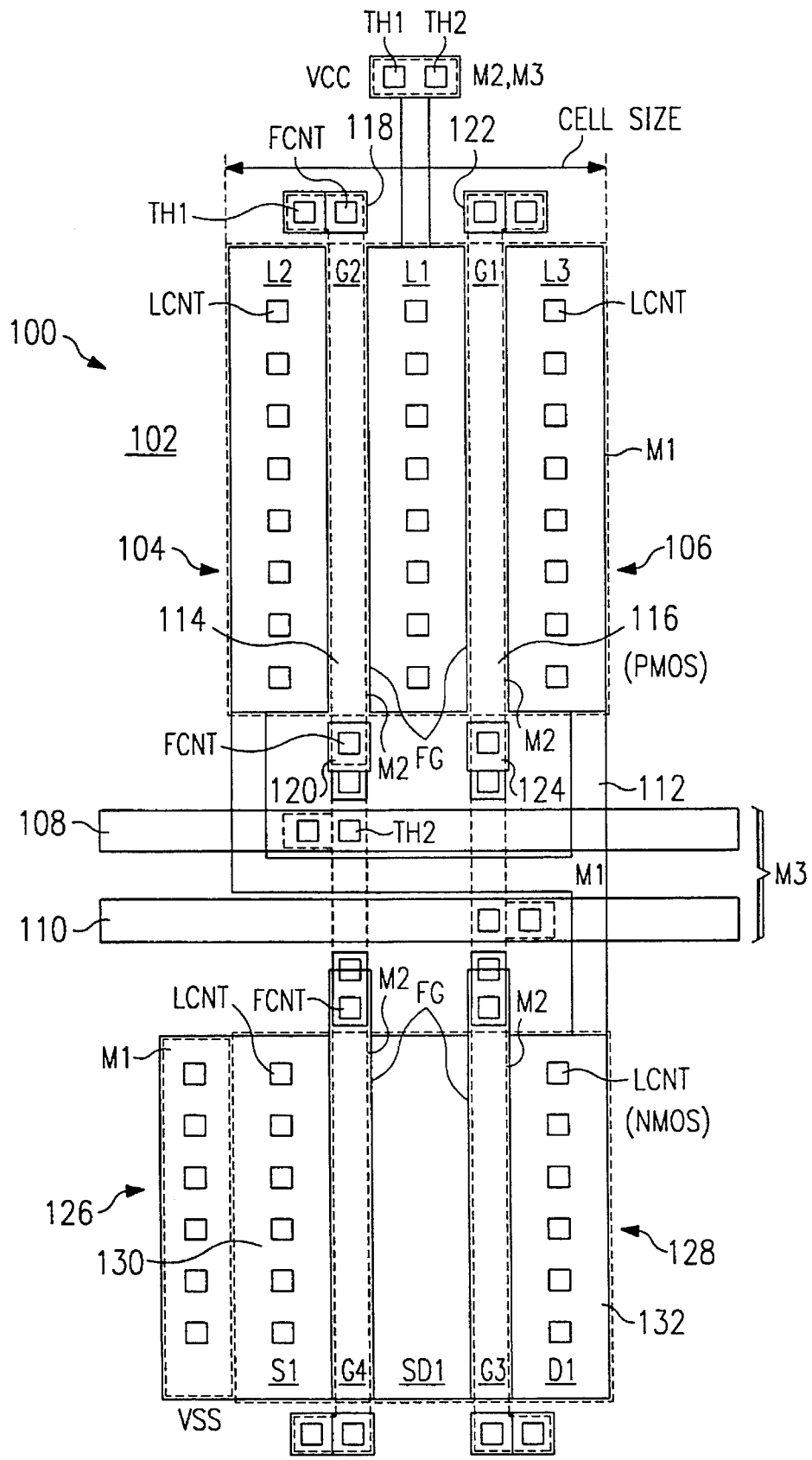
FIG. 1 is a layout drawing of a logic gate circuit mounted in a semiconductor integrated circuit embodying the present invention.

Reference numerals and symbols as shown in the drawings:

M1 . . . First wiring layer, M2 . . . Second wiring layer, M3 . . . Third wiring layer, TH1, TH2 . . . vias, LCNT, FCNT . . . Contacts, PMOS . . . P-channel MOSFET, NMOS . . . N-channel MOSFET, FG . . . First polysilicon (gate electrode), SG . . . Second polysilicon (storage node), TG . . . Third polysilicon (plate), W . . . Channel width.

DESCRIPTION OF PREFERRED EMBODIMENTS

FIG. 1 is a layout drawing of a logic gate circuit mounted in a semiconductor integrated circuit embodying the present invention. In FIG. 1, there is shown a NAND gate circuit 100 which is a CMOS (Complementary MOS) in structure by way of example. In this case, known semiconductor integrated circuit processing technology is employed for forming such a circuit on a monocrystalline semiconductor substrate 102.

According to the present embodiment, the circuit is formed with a three-layer metal wiring layer comprising M1–M3. The first metal wiring layer M1 contains, though not limited to, tungsten as the main ingredient, whereas the second and third metal wiring layers M2, M3 contain, though not limited to likewise, aluminum as the main ingredient.

As shown in FIG. 1, two P-channel MOSFETs (PMOSs) 104, 106 parallel each other with two input signal lines 108, 110 held therebetween as the third wiring layer M3 extending laterally in the central portion. More specifically, with a central diffusion layer L1 as a common source region, there are formed diffusion layers L2, L3 as drain regions on both sides of the source region while polysilicon layers FG as gate electrodes G1, G2 are held therebetween. The first wiring layer M1 causes power supply voltage VCC to be supplied to the source region 4. The end side of the wiring layer M1 opposite the connection to the source region is connected via a first via TH1 to the second wiring layer M2, and via a second via TH2 to the third wiring layer M3. The third wiring layer M3 is extended as the supply line of the power supply voltage VCC, though the illustration of it has been omitted. The drains L2, L3 of the two MOSFETs 104, 106 are connected together by a part 112 of the first wiring layer M1 via contacts LCNT.

Two parts 114, 116 of the second wiring layer M2 are formed via an insulating film above and along the two polysilicon layers FG as the gate electrodes G1, G2 corresponding to the two P-channel MOSFETs. Each FG forming the gate electrode is connected by the contact FCNT to parts 118, 120 and parts 122, 124 respectively of the first wiring layer M1 and connected via the first through-hole vias TH1 to the two parts 114, 116 of the second wiring layer M2 with the parts of the wiring layer M1 held therebetween.

Two N-channel MOSFETs (NMOSs) 126, 128 are connected in series in the lower half portion with the two input signal lines 108, 110 in the third wiring layer M3 laterally extended to the central portion above as those held therebetween. More specifically, the central diffusion layer is used as a common source-drain SD1, and the drain D1 and the source S1 are formed on both sides with the polysilicon layers FG as the gate electrodes G3, G4 held therebetween. Of the two N-channel MOSFETs 126, 128 connected in series, the source region of the MOSFET on the left-hand side is connected via the contacts LCNTs to a part 132 of the first wiring layer M1, and the other side thereof is connected to the ground potential VSS of the circuit. The drain region D1 of the MOSFET positioned on the right-hand side is connected by a part 132 of the first wiring layer M1 via the contacts LCNTs to the drain of the P-channel MOSFET. The output nodes 112, 132 and are transmitted to the inputs for the following stage (not shown).

When the output nodes are transmitted to the circuit at the following stage by means of the third wiring layer M3 likewise, the first wiring layer connected to the output nodes is connected to the third wiring layer M3 via the second wiring layer M2. While the circuit at the following stage is located close to the MOSFET, it may, though not limited to, be extended by the first wiring layer M1 up to the neighborhood of the gate of MOSFET at the following stage, so that the signal is supplied from both end sides of the gate electrode by means of the second wiring layer M2.

According to the present embodiment, parts of the first wiring layer M1 are used to connect to the source and drain regions of the MOSFETs, whereas parts of the second wiring layer M2 are used to form the wiring for the input signal on the gate electrodes. With this arrangement, it is unnecessary to leave any allowance for mask alignment on matching between the first and second wiring layers M1, M2. As shown in FIG. 1, further, the formation of the wiring layers M1, M2 can be made to correspond to the peripheries of the source and drain regions, and the periphery and size of the gate electrodes, whereby the resistance value of the polysilicon gate material can practically be reduced.

Since the input signal supplied to the gate electrode of the MOSFET is input from both sides via parts of the second wiring layer M2 which is formed on the gate electrodes and has a small resistance value, the equivalent resistance value of the gate electrodes is reducible by a large margin and the switching characteristics may be improved. With the input wiring layer M2 thus formed superimposed on the gate electrodes, the layout area can be reduced as the lateral cell size also becomes reducible.

Figure 2:
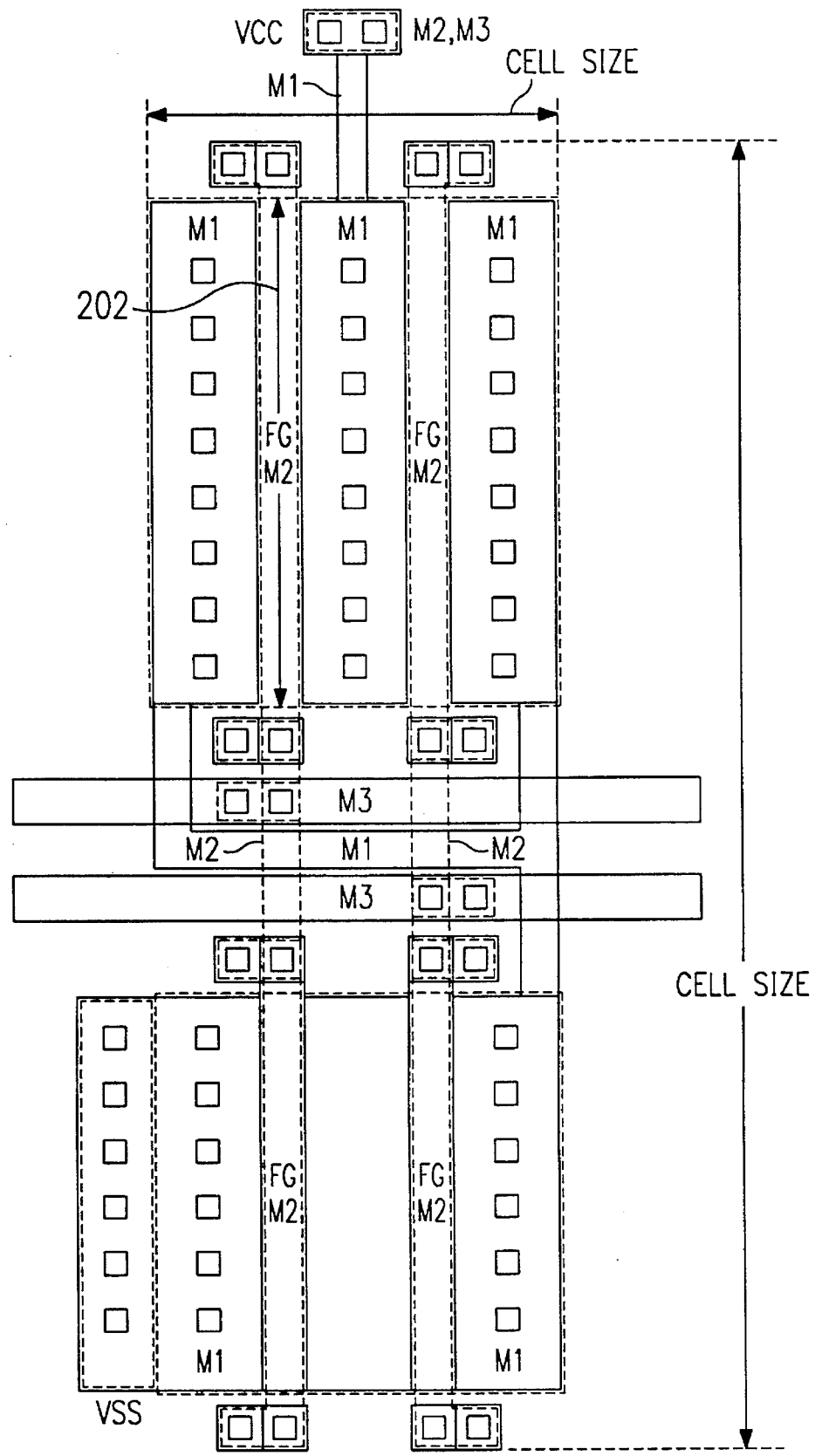
FIG. 2 is a layout drawing of another logic gate circuit mounted in a semiconductor integrated circuit embodying the present invention.

FIG. 2 is a layout drawing of another logic gate circuit loaded in a semiconductor integrated circuit embodying the present invention. When the NAND gate circuit as what is shown in FIG. 1 is formed according to the present embodiment, a contact for connecting the first polysilicon layer FG as a gate electrode to the second metal wiring layer is bent or formed in the direction of channel length or to the side of the long axis 208 of the channel. With this arrangement, contact holes FG and through-holes TH1 that have been arranged vertically as shown in FIG. 1 are arranged laterally like the upper side of the P-channel MOSFET and the lower side of the N-channel MOSFET. Therefore, the cell size in the vertical direction can be reduced. As the rest is similar in structure to what is shown in FIG. 1, the description thereof will be omitted.

Figure 3:
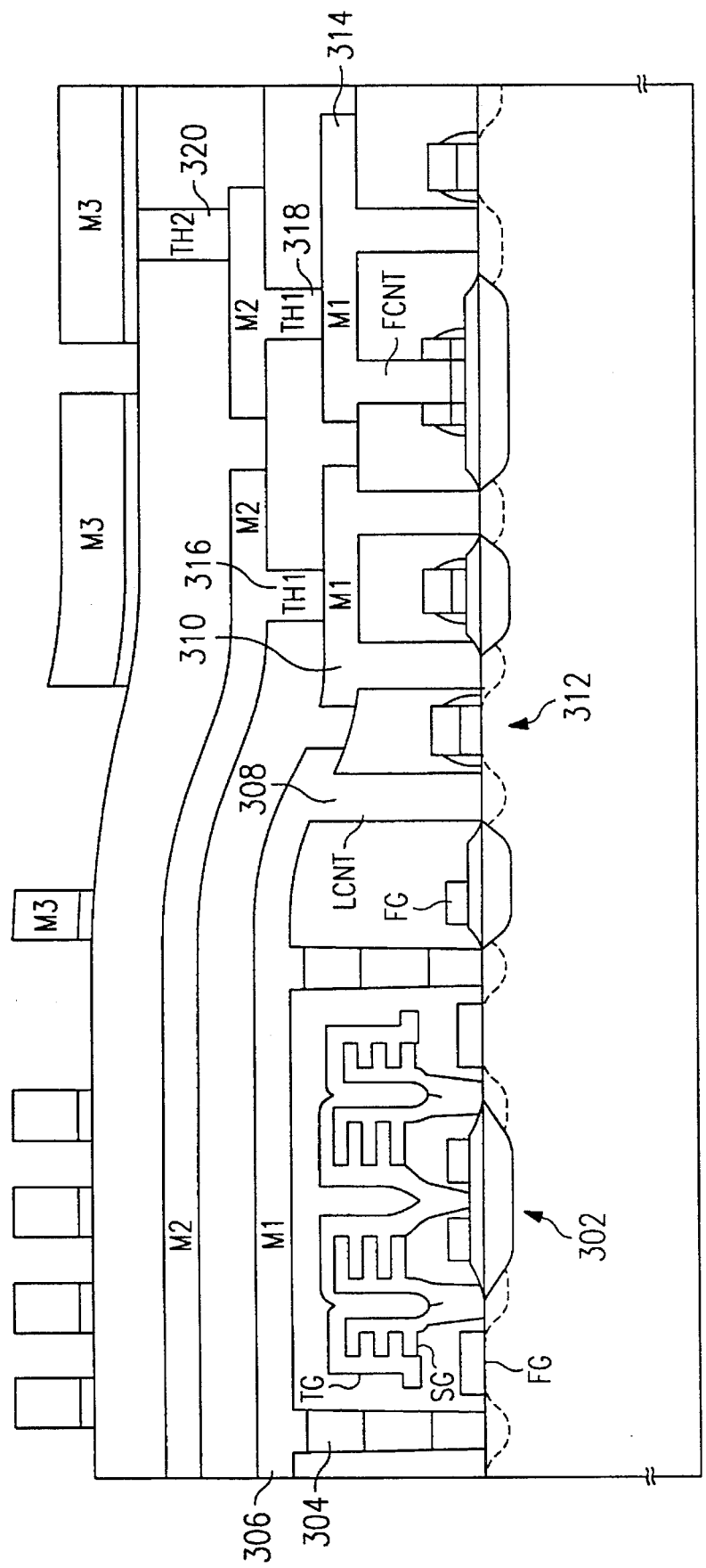
FIG. 3 is a cross-sectional view of an element structure in a semiconductor integrated circuit embodying the present invention.

FIG. 3 is a cross-sectional view of an element structure in a semiconductor integrated circuit embodying the present invention. In FIG. 3, there is shown an array and an element structure in an indirect peripheral portion of a dynamic RAM on which the logic gate above is mounted by way of example.

A storage capacitor of a memory cell 302 uses a second polysilicon layer SG as a storage node and is connected to the source and drain on one side of an address selection MOSFET. The second polysilicon layer is of a fin structure and formed with a third polysilicon layer TG as a plate electrode via a thin gate insulating film. The gate of the address selection MOSFET is formed with the first polysilicon layer FG. The other source and drain of the address selection MOSFET are connected to the first wiring layer M1 via the polysilicon layers FG, SG and TG or vias 304.

A bit line (or a data or digit line) is formed by a part 306 of the wiring layer MI.

Two N-channel MOSFETs are formed in the indirect peripheral portion. Part 308 and 310 of the first wiring layer M1 are connected via contacts LCNT to the source and drain of MOSFET 312. Other parts 314 are connected via contacts FCNT to the first polysilicon layer FG. Further, the first and second wiring layers M1, M2 are connected via the first vias 316, 318 TH1, and the second and third wiring layers M2, M3 are connected via the second via 320 TH2.

When the second wiring layer M2 is used to supply the input signal to both sides of the gate electrode of the MOSFET, the input signal is dropped via the first via 316, TH1 into the first wiring layer M1 as a dummy. In this case, the first wiring layer M1 is connected via the contacts LCNT to the first polysilicon layer FG as the gate electrode.

The third wiring layer M3 for use in supplying the input signal is connected via the second via 320 TH2 to the second wiring layer M2. When an output signal is supplied to the circuit at the following stage, for example, the first wiring layer M1 is connected via the first through-hole TH1 to the second wiring layer M2 as a dummy and with the wiring layer M2 as what is held therebetween, it is led via the second through-hole TH2 to the third wiring layer M3.

Figure 4:
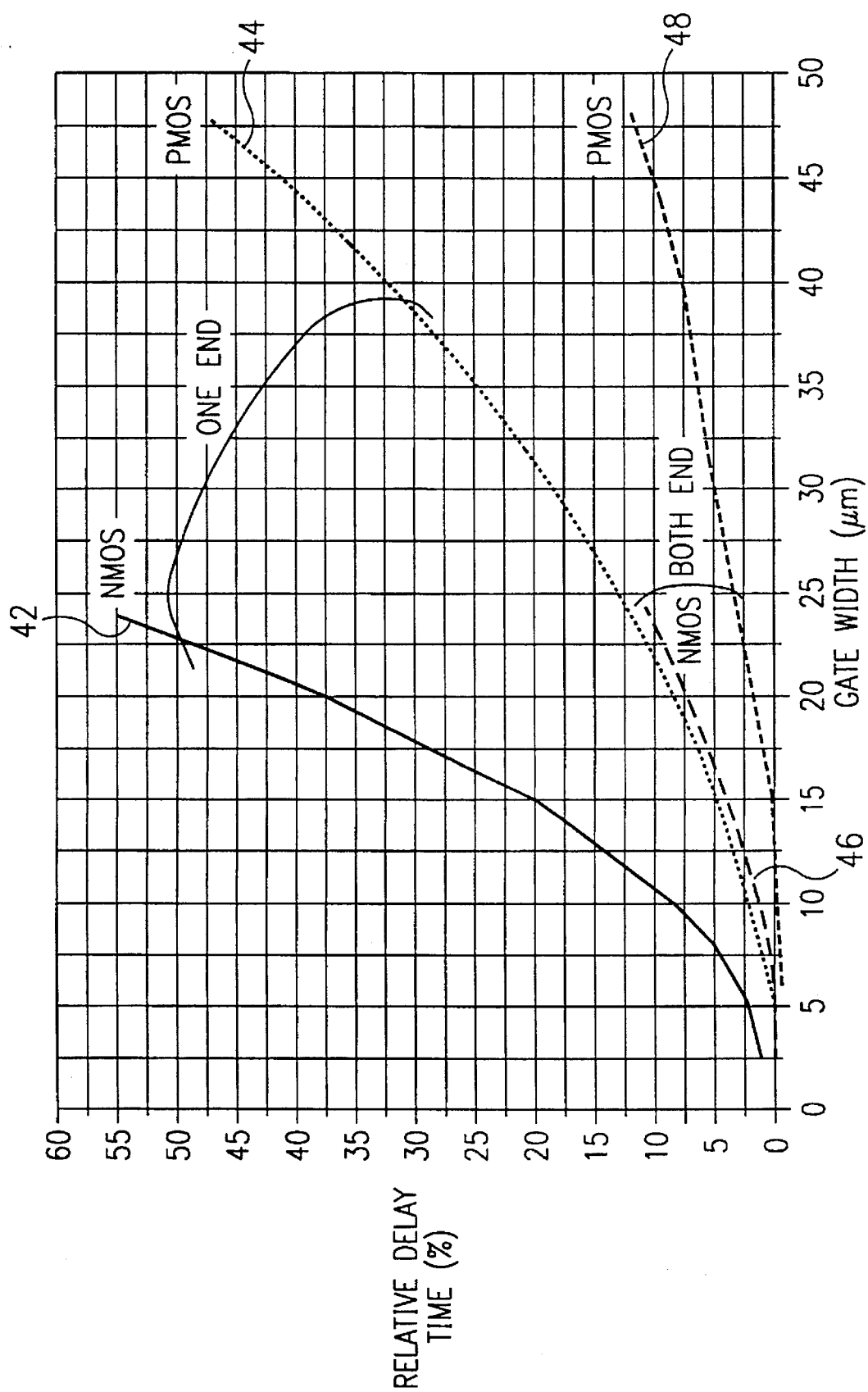
FIG. 4 is a graphical illustration of relative delay time versus gate width in a MOSFET constructed in accordance with the present invention.
Figure 5:
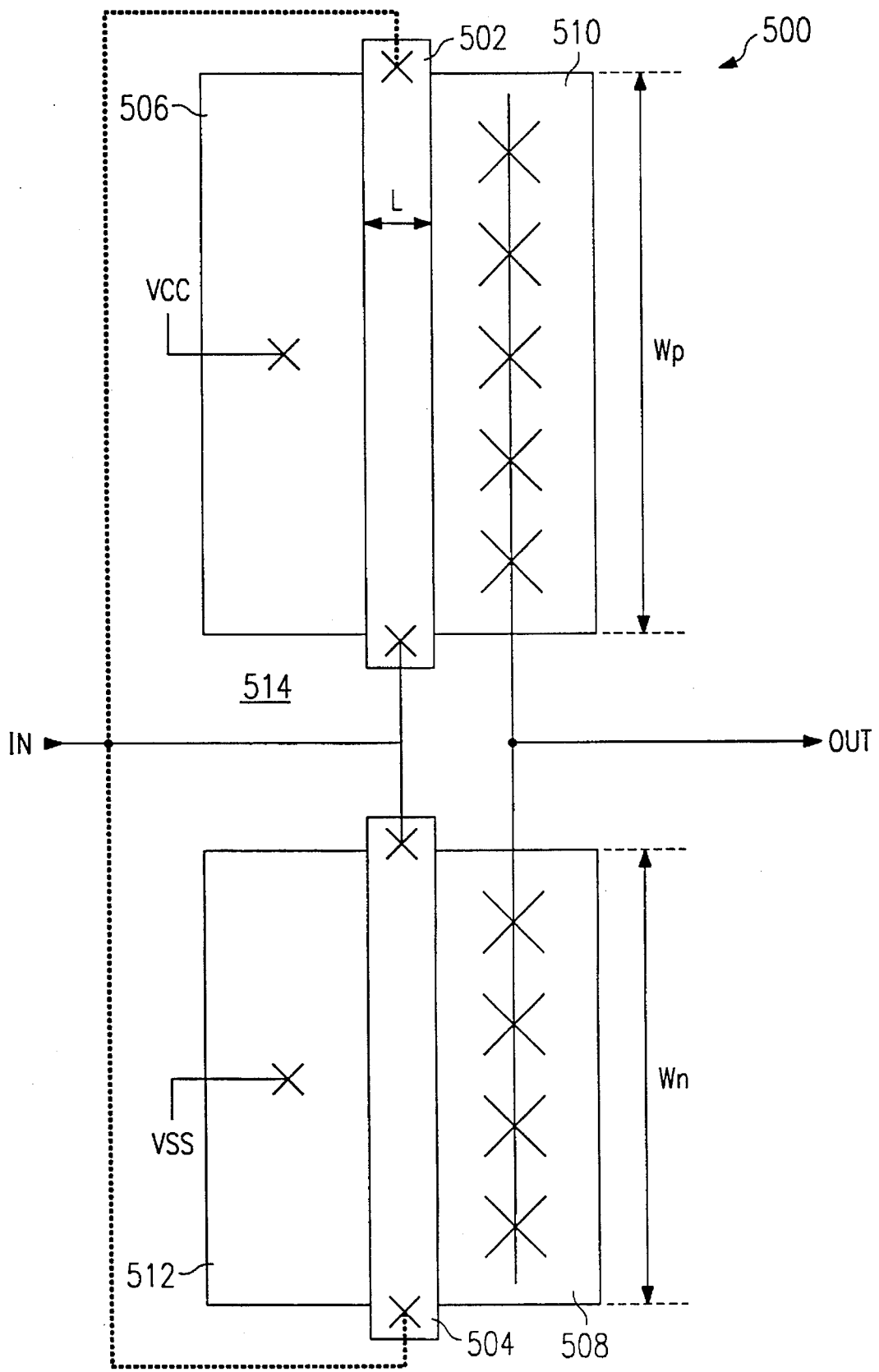
FIG. 5 is a schematic layout drawing illustrating an example of a conventional MOSFET.

FIG. 4 is a graph illustrating the characteristics of the MOSFET according to the present invention. In FIG. 4, there are shown gate width and relative delay time when the input signal is supplied from one end curves 42, 44, and both ends 46, 48 to the gate electrode of the MOSFET. The results shown in FIG. 4 are those obtained from a model circuit resulting from computer simulation and as apparent from FIG. 4, it will be understood that the switching characteristics are greatly improved by supplying the input signal from both end sides of the MOSFET.

The functions and effects obtainable from the above embodiments are as follows:

(1) High-speed operation is made possible without increasing the layout area by forming the metal wiring layer via the insulating film above and along the gate electrode of the MOSFET whose channel length can be reduced or channel width can be increased.

(2) The second layer is used as the metal wiring layer formed along the gate electrode of the MOSFET, whereas the first layer is used as the wiring layer connected to the source and drain of the MOSFET, whereby the resistance value of the metal wiring layer formed on the gate electrode can practically be reduced without the necessity of providing any allowance for mask matching between the first and second wiring layers.

(3) The cell size in the direction of channel width can be reduced by connecting the gate electrode to the second wiring layer by bending at least one end of the gate electrode in the direction of channel length of the MOSFET to provide contacts thereat.

As many apparently widely different embodiments of this invention may be made without departing from the spirit and scope thereof, it is to be understood that the invention is not limited to the specific embodiments as described herein. For example, the MOSFET whose channel length can be reduced or channel width can be increased may be used to form not only the NAND gate circuit according to the present invention, but also an inverter circuit or a NOR gate circuit and may also be utilized in a high-speed switching operation. Further, the second wiring layer M2 may be replaced with the third wiring layer M3.

The present invention is widely applicable to semiconductor integrated circuits using MOSFETS. In accordance with the invention, a metal wiring layer is formed above and along the gate electrode of a MOSFET, whose channel length is small or channel width is large, through the insulating film and the input signal is applied from at least both end sides of the gate electrode. Thereby, high-speed operation is possible without increasing the layout area.

We claim:

1. A transistor layout for a semiconductor integrated circuit comprising:

A. a substrate of semiconductor material;
   B. MOS field effect transistor formed in and on the substrate including:
      i. a source region having a defined periphery formed in the substrate;
      ii. a drain region having a defined periphery formed in the substrate;
      iii. a channel region having a defined periphery formed in the substrate between and abutting the peripheries of the source region and drain region; and
      iv. a gate having a defined periphery formed over the channel region and the periphery of the gate being substantially superimposed over the periphery of the channel region, the gate being formed of polysilicon having a certain resistance and the gate having two ends;
   C. a first metal layer formed over selected areas of the semiconductor substrate and insulated from the gate, the first metal layer including a first part formed over one of the source and drain regions and connected to the one of the source and drain regions by at least one vertically extending via, and the first metal layer including second parts, separate from one another, formed over parts of the gate and connected to the gate by vertically extending vias, the first and second parts of the first metal layer being insulated from one another;
   D. a second metal layer formed over selected areas of the semiconductor substrate and insulated from the first metal layer and gate, the second metal layer including a first part formed over the gate and over the second parts of the first metal layer and connected to the second parts of the first metal layer by vertically extending vias, and the second metal layer having a certain resistance less than the gate to conduct a control signal applied to the first part of the second metal layer to the gate.

2. The transistor layout of claim 1 including a third metal layer formed over selected areas of the substrate and insulated from the first and second metal layers and the gate, the third metal layer including a first part connected to the first part of the second metal layer by vertically extending vias, the third metal layer carrying the control signal.

3. The transistor layout of claim 1 in which the gate has a long axis, there is one set of vias connecting the gate, first metal layer and second metal layer aligned with the long axis, and there is another set of vias aside the long axis.

4. The transistor layout of claim 1 in which the channel length between the source and drain regions is short enough and the channel width parallel to the source and drain regions is long enough for gate resistance to slow transistor switching speed.

5. The transistor layout of claim 1 in which the channel length between the source and drain regions is short enough for gate resistance to slow transistor switching speed.

6. The transistor layout of claim 1 in which the channel width parallel to the source and drain regions is long enough for gate resistance to slow transistor switching speed.

7. The transistor layout of claim 1 in which the second parts of the first metal layer connect to both ends of the gate.

8. The transistor layout of claim in which the first part of the first metal layer has a periphery corresponding to the periphery of the one of the source and drain regions and the first part of the second metal layer has a periphery corresponding to the periphery of the gate.

* * * * *